US006714575B2

(12) United States Patent
Evans

(10) Patent No.: US 6,714,575 B2
(45) Date of Patent: Mar. 30, 2004

(54) OPTICAL MODULATOR SYSTEM

(75) Inventor: Gary A. Evans, Plano, TX (US)

(73) Assignee: Photodigm, Inc., Richardson, TX (US)

( * ) Notice: Subject to any disclaimer, the term of this patent is extended or adjusted under 35 U.S.C. 154(b) by 0 days.

(21) Appl. No.: 10/091,389

(22) Filed: Mar. 5, 2002

(65) Prior Publication Data
US 2002/0136259 A1 Sep. 26, 2002

Related U.S. Application Data
(60) Provisional application No. 60/273,668, filed on Mar. 5, 2001.

(51) Int. Cl.[7] ................................................ H01S 5/00
(52) U.S. Cl. ......................................... 372/50; 572/54
(58) Field of Search .......................... 372/50, 102, 103, 372/108

(56) References Cited

U.S. PATENT DOCUMENTS

| | | | | |
|---|---|---|---|---|
| 4,006,432 A | | 2/1977 | Streifer et al. ......... 331/94.5 C |
| 4,114,257 A | * | 9/1978 | Bellavance ................ 438/24 |
| 4,790,615 A | * | 12/1988 | Seki et al. .................. 385/129 |
| 4,802,187 A | * | 1/1989 | Bouley et al. ............... 372/96 |
| 4,875,772 A | * | 10/1989 | Gentile ..................... 356/73.1 |
| 4,884,112 A | * | 11/1989 | Lorenzo et al. .............. 257/86 |
| 4,919,507 A | | 4/1990 | Evans et al. ............. 350/96.19 |
| 4,958,357 A | | 9/1990 | Kinoshita .................... 372/96 |
| 5,002,355 A | * | 3/1991 | Caron ......................... 385/17 |
| 5,003,550 A | * | 3/1991 | Welch et al. ................. 372/50 |
| 5,070,509 A | * | 12/1991 | Meyers ........................ 372/45 |
| 5,135,295 A | * | 8/1992 | Jen et al. ..................... 385/13 |
| 5,200,939 A | * | 4/1993 | Nishiwaki et al. ....... 369/44.12 |
| 5,274,655 A | * | 12/1993 | Shieh et al. .................. 372/45 |
| 5,305,336 A | * | 4/1994 | Adar et al. ................... 372/18 |
| 5,444,801 A | * | 8/1995 | Laughlin ..................... 385/16 |
| 5,515,354 A | * | 5/1996 | Miyake et al. ......... 369/112.07 |
| 5,546,484 A | * | 8/1996 | Fling et al. .................. 385/16 |
| 5,548,671 A | * | 8/1996 | Wu et al. ..................... 385/37 |
| 5,553,175 A | * | 9/1996 | Laughlin .................... 385/16 |
| 5,555,558 A | * | 9/1996 | Laughlin .................... 385/16 |
| 5,566,260 A | * | 10/1996 | Laughlin .................... 385/16 |
| 5,602,863 A | * | 2/1997 | Itagaki ........................ 372/50 |
| 5,630,004 A | * | 5/1997 | Deacon et al. ............. 385/129 |
| 5,633,968 A | * | 5/1997 | Sheem ........................ 385/53 |
| 5,673,284 A | | 9/1997 | Congdon et al. ............ 372/50 |
| 5,764,384 A | * | 6/1998 | Wilcox et al. .............. 358/498 |
| 5,802,222 A | * | 9/1998 | Rasch et al. .................. 385/1 |
| 5,828,688 A | * | 10/1998 | Cook et al. .................. 372/96 |
| 5,901,164 A | * | 5/1999 | Flanigan et al. ............. 372/26 |

(List continued on next page.)

OTHER PUBLICATIONS

"Surface Emitting Semiconductor Lasers and Arrays", Ed. Evans and Hammer, Academic Press, 1993.

(List continued on next page.)

Primary Examiner—Paul Ip
Assistant Examiner—Tuan N. Nguyen
(74) Attorney, Agent, or Firm—Duke W. Yee; Patrick C. R. Holmes; Stephen R. Tkacs

(57) ABSTRACT

A modulation technique for optical signals. A laser diode having an outcoupling grating in the waveguide between two reflectors is provided. A second waveguide is positioned next to the first waveguide. The first end of the second waveguide is optically connected to the first waveguide on one side of the outcoupling grating, while the second end of the second waveguide is optically connected to the first waveguide on the other side of the outcoupling grating. Switches are provided that control the amount of light coupled between the waveguides. For example, when the switches are in a first state, no light is coupled between the two waveguides, and all the light stays in the laser diode or is coupled out of the outcoupling grating, while none of the light couples into the second grating; and when the switches are in a second state, some or all of the light from the first waveguide is coupled into the second waveguide. By toggling the states of the switches, the light emitted from the laser diode is modulated.

20 Claims, 9 Drawing Sheets

U.S. PATENT DOCUMENTS

| | | | | |
|---|---|---|---|---|
| 5,909,279 | A | * | 6/1999 | Pepper et al. ............... 356/479 |
| 5,914,972 | A | * | 6/1999 | Siala et al. .................... 372/33 |
| 5,915,051 | A | * | 6/1999 | Damask et al. ............... 385/16 |
| 5,970,081 | A | | 10/1999 | Hirayama et al. ............ 372/96 |
| 6,064,783 | A | | 5/2000 | Congdon et al. ............. 385/15 |
| 6,081,636 | A | * | 6/2000 | Kinoshita .................... 385/24 |
| 6,108,074 | A | * | 8/2000 | Bloom ...................... 356/73.1 |
| 6,341,118 | B1 | * | 1/2002 | Drobot et al. ............... 369/118 |
| 6,381,382 | B2 | * | 4/2002 | Goodman et al. ............ 385/22 |
| 6,404,797 | B1 | * | 6/2002 | Mooradian ................... 372/96 |
| 6,449,404 | B1 | * | 9/2002 | Paiam .......................... 385/16 |
| 6,459,715 | B1 | * | 10/2002 | Khalfin et al. ................ 372/50 |
| 6,529,300 | B1 | * | 3/2003 | Milton et al. ................. 398/59 |

OTHER PUBLICATIONS

"Optimized Couplers Between Junction Lasers and Single Mode Fibers", Hammer, Neil, RCA Laboratories, Princeton, NJ, Final Report, Aug. 31, 1981–Jan. 31, 1983.

"Observations and Theory of High Power Butt Coupling to $LiNbO^3$–type Waaveguides", Hammer and Neil, IEEE J. Quantum Electronics, QE–18, 1751–1758, Oct. 1982.

"Bow–Tie Surface Emitting Lasers", Bedford, R., Luo, H., Fallahi, M., IEEE Photonics Tech. Let., vol. 12, No. 8, Aug. 2000.

"Surface–Emitting Distributed Feedback Quantum–Cascade Lasers", Schrenk, W. et al., Applied Physics Letters, vol. 77, No. 14, Oct. 2, 2000.

"Analysis of Grating Surface Emitting Lasers", Noll, R.J., Macomber, S.H., IEEE Journal of Quantum Electronics, vol. 26, No. 3, Mar. 1990.

"Facetless Bragg Reflector Surface–Emitting AlGaAs/GaAs Lasers Fabricated by Electron–Beam Lithography and Chemically Assisted Ion–Beam Etching", Tiberio, R.C., et al., J.Vac.Sci.Technol. B9 (6), Nov./Dec. 1991.

"Laser Diode End Fire Coupling into $Ti:LiNbO_3$ Waveguides", Burns, Appl, Optics, 18, 2536–2537, Aug. 1979.

Research Toward Optical Fiber Transmission Systems Part 1, Miller et al., Proc. IEEE, 61, 1703–1751, Dec. 1973.

* cited by examiner

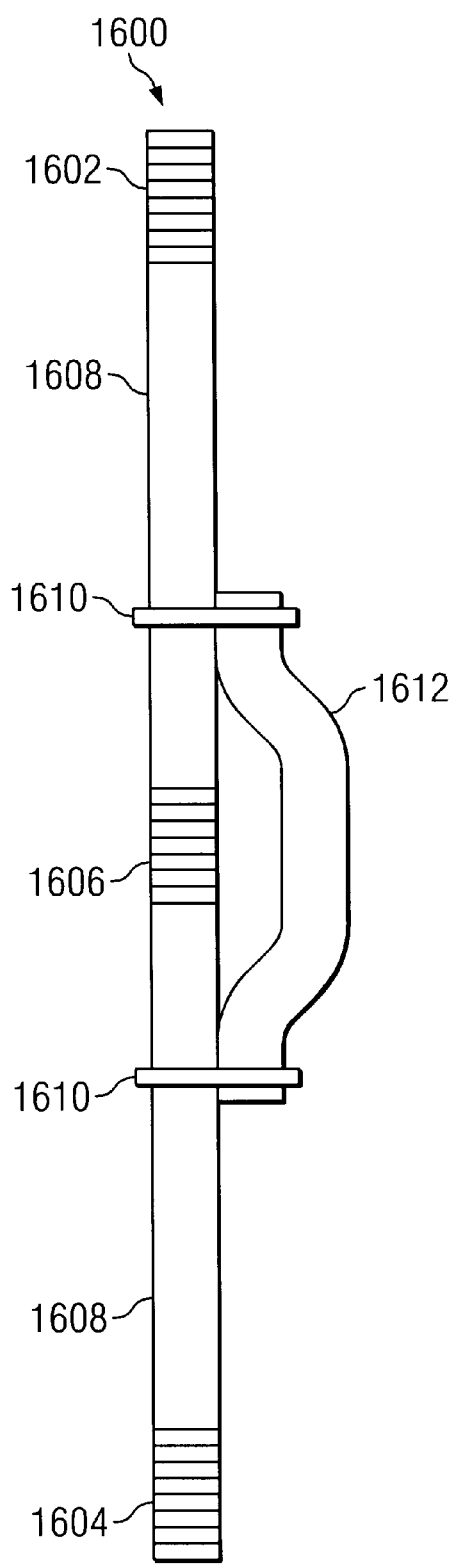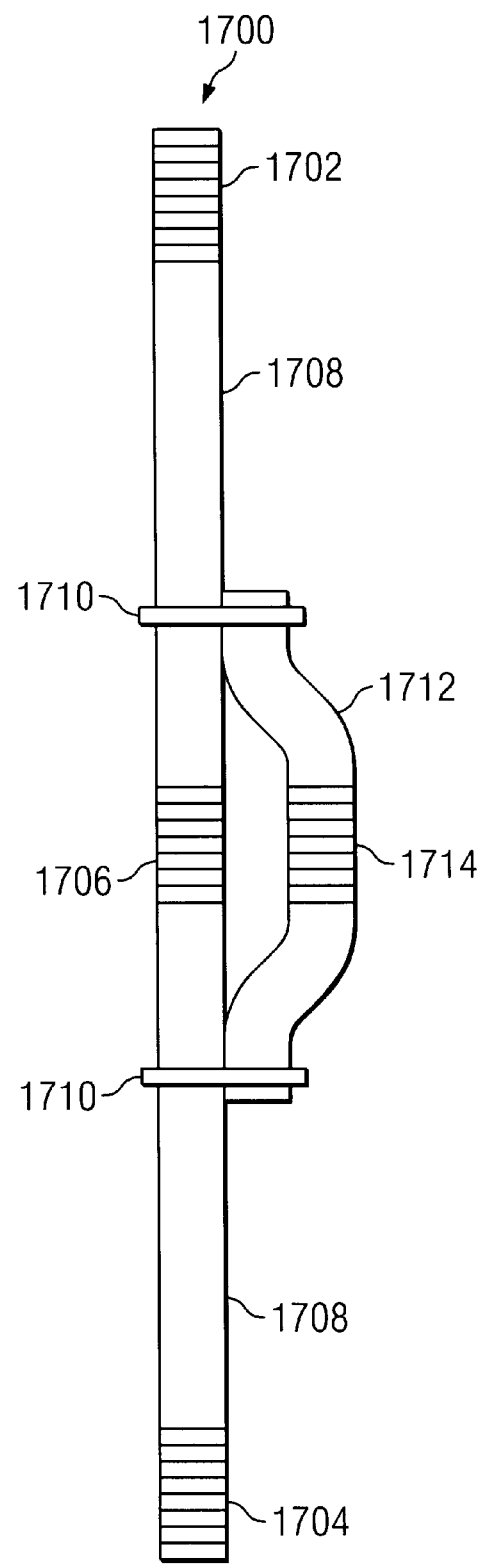
*FIG. 16*   *FIG. 17*

OPTICAL MODULATOR SYSTEM

RELATED APPLICATIONS

The present application is related to, and claims the benefit of priority, of co-pending provisional U.S. Patent Application Serial No. 60/273,668 entitled "Optical Modulator System," filed on Mar. 5, 2001, which is hereby incorporated by reference in its entirety.

BACKGROUND OF THE INVENTION

1. Technical Field

The present application relates to laser diodes, and more particularly to extracting and modulating light from a waveguide and coupling that light to a fiber or other device.

2. Description of Related Art

Transmission of light through waveguides has been pursued for many types of communications applications. Light signals offer many potential advantages over electronic signals. Light sources are commonly created from semiconductor devices, and include semiconductor devices such as LEDs (Light Emitting Diodes) and LDs (Laser Diodes).

Optical fiber is the most commonly used transmission medium for light signals. A single fiber is capable of carrying several different modulated signals within it at one time. For instance, wavelength division multiplexing divides the used bandwidth of the fiber into different channels (each channel containing a small range of wavelengths) and thus transmits several different wavelengths (or signals) of light at once. Using such a system requires sources for the different wavelengths. More wavelengths on the fiber require more sources to be coupled to the fiber.

Efficient coupling of light into a fiber is simplified if the laser beam has a cross sectional profile that matches the profile of the fiber mode(s). Efficient use of light for communications requires that the light have high temporal coherence. Efficient coupling of light to monomode guides requires spatial coherence. Spatial coherence requires the laser to operate in a single lateral and transverse mode. Temporal coherence requires the laser to operate in a single longitudinal mode and implies a very narrow bandwidth, or range of wavelengths.

The most coherent semiconductor lasers use resonators based on grating feedback rather than Fabry-Perot resonators with reflective end facets. Distributed feedback (DFB) lasers use a Bragg reflective grating covering the entire pumped length of the laser. An alternative to DFB lasers is the use of distributed Bragg reflectors (DBRs) located outside the pumped region.

In conventional DFB and DBR lasers, light is removed through an end facet and the output beams have dimensions entirely controlled by the vertical (i.e., normal to the surface) (x) and lateral (y) size and the composition of the guiding structure. Such output beams are typically have too great a divergence for effective coupling to optical fibers, or for other applications requiring beams with low divergence angles.

Beam dimensions (in at least one direction) larger than that available from laser facets may be obtained by using a Bragg grating to couple light out of the waveguide normal (or at certain fixed angles) to the waveguide surface. So called second order Bragg gratings have a period equal to the wavelength of light of the guided mode. The second grating order of such a grating reflects some of the light back in the waveguide plane while the first order couples some of the light normal to the plane. So called first order (Bragg) gratings have a period equal to one half the wavelength of light in the guided mode, reflect light in the waveguide plane, and do not couple light out of the waveguide. First, second, and third order (etc.) gratings are sometimes referred to as being in resonance. A non-resonant grating couples light out of the waveguide at an angle to the normal and does not reflect any light in the waveguide plane.

U.S. Pat. No. 5,970,081 to Hirayama et al. appears to show a laser with a distributed feedback (DFB) grating of second order or higher that claims to obtain a Gaussian shaped output beam by narrowing the waveguide or using a chirped grating at the outcoupling portion. They do not seem to recognize that by so doing the resonant wavelength of the grating is altered along the length of the narrowing or chirping. This would be expected to result in an output which will fan in angle along the longitudinal direction rather than produce a simple Gaussian intensity variation emitted normal to the plane as claimed. They do not define the beam shape in the lateral direction. In all versions they choose second order outcoupling gratings which, absent a narrowing waveguide or chirp, would emit light perpendicular to the surface of the laser waveguide.

U.S. Pat. No. 4,006,432 to Streifer et al. appears to show a grating out-coupled surface emitting DFB laser. The grating period may be chosen to be either resonant or not.

A paper by Bedford, Luo, and Fallahi titled Bow-Tie Surface-Emitting Lasers (IEEE Photonics Technology Letters, Vol. 12, No. 8, August 2000) appears to show a DBR laser with curved second order grating at the ends to couple light out of the waveguide. The same gratings are used for outcoupling and for reflecting the light within the waveguide. They mention the use of non-resonant gratings in conjunction with reflector gratings if emission at other than the direction normal the waveguide plane is desired. The paper appears to show a flared resonator region which allows symmetric outcoupling from both ends of the laser. This facilitates two outputs that are coherent with one another, with emission in the same direction. Such a device is meant to alleviate the complications of controlling the relative phase between the two emitters.

The Tiberio article (Facetless Bragg reflector surface-emitting AlGaAs/GaAs lasers . . . , J. Vac. Sci. Technol., B9(6), 1991) appears to show a surface emitting laser diode that uses first order reflective gratings and either second order (or non-resonant) gratings for outcoupling. Thus, depending on the chosen grating period, the outcoupled beam can be normal or at an angle to the surface.

U.S. Pat. No. 6,064,783 to Congden appears to show a DBR laser with a grating assisted waveguide coupler that couples light from the laser waveguide to a parallel fiber-like glass waveguide for later coupling to a fiber. Several different lasers are coupled to similar fiber-like glass waveguides in the figures. The fiber axis is parallel to the laser waveguides. This reference mentions that this model is easily attached to a fiber through "butt coupling." The grating acts as a Quasi Phase Matching element to couple the light from the laser waveguide to the fiber-like glass waveguide.

The optical and electronic properties of a semiconductor depend on the crystal structure of the device, which has led to investigative work into fabricating artificial structures or superlattices. By tailoring the crystal structure of a device during its fabrication, the optical and electronic properties can be controlled. The crystal structures of such devices may be controlled, for instance, by molecular beam epitaxy (MBE) and metal-organic chemical vapor deposition (MOCVD). Such techniques are capable of monolayer control (~5 angstrom) over the chemical composition of a crystal.

Other commonly used heterostructures are quantum wells, in which a single layer of one semiconductor is sandwiched between two layers of a larger bandgap material. Strain is produced by using an epitaxial layer with a different lattice constant than the substrate. This strain has a dramatic effect on the properties of the optical system. Among other things, it can allow bandgap tunability, reduced threshold current, and improved laser reliability.

Strain can also allow laser emission to have tailored polarization. By using appropriate strain, one can produce light predominantly polarized as TE, or TM.

SUMMARY OF THE INVENTION

This application discloses a laser source and modulation system. In a preferred embodiment, the source is a laser diode and has an active region with distributed Bragg reflectors at either end to reflect light within the cavity, and an outcoupling grating in the center or elsewhere within the cavity (defined by the end DBRs) of the device which couples light out of the cavity. On either side of the outcoupling grating is a gain region with electrical contacts for supplying current. In some embodiments, the outcoupling grating may be at the end of a gain region with only a DBR and not a gain region on the other side.

Modulation of the laser light generated in the laser source is accomplished, in a preferred embodiment, by placing a second waveguide next to the primary waveguide. This second waveguide is coupled to the primary waveguide on either side of the outcoupling grating by optical switches. When the switches are in a first state, light oscillates normally within the primary waveguide and only a small amount or none of the light is transferred into the second waveguide. When the switches are toggled, some or all of the light from the primary waveguide is deflected into the second waveguide, thus affecting the intensity of the light coupled out of the outcoupling grating. By toggling the switches in a systematic way, the output light is intensity modulated. Because of the difference in length between the second waveguide and the primary waveguide, the outcoupled light from the primary waveguide may experience a phase or frequency change when a portion of the light is routed to the second waveguide. This mechanism allows phase and/or frequency modulation.

Other example embodiments include forming the second waveguide from an electro-optic material, then placing electrodes on either side of the second waveguide so as to affect the phase, intensity, frequency, or amplitude of the light within the second waveguide. By varying the optical properties of the second waveguide, constructive or destructive interference is generated between the light in the two waveguides. This interference can be used to modulate the light out of the outcoupling grating.

This basic design makes it easier to limit the length of the outcoupling grating to short lengths, on the order of about 10 microns. In designs where the outcoupler is outside the DBR laser region, it becomes very difficult to outcouple 100% of the light in such a short distance. The light that is not coupled out is wasted and decreases device efficiency.

The disclosed innovations, in various embodiments, provide one or more of at least the following advantages:

low cost;

device testing at the wafer level;

emission at all wavelengths from 0.6–2.0 microns with existing and common material systems, with greater ranges possible;

emission is easily extended to any wavelength as new material systems and laser designs mature and/or are developed;

low drive currents;

higher power capability than existing VCSELS;

high efficiency;

direct replacement for VCSELs;

easily coupled to multi-mode and single-mode fibers.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 7b shows a close up of the crossed gratings for the laser system of FIG. 7a.

FIG. 16 shows an embodiment of an optical modulation system according to the present innovations.

FIG. 17 shows an embodiment of an optical modulator where a secondary waveguide also has an outcoupling grating, according to the present innovations.

DETAILED DESCRIPTION OF THE PREFERRED EMBODIMENT

Figure 1A:
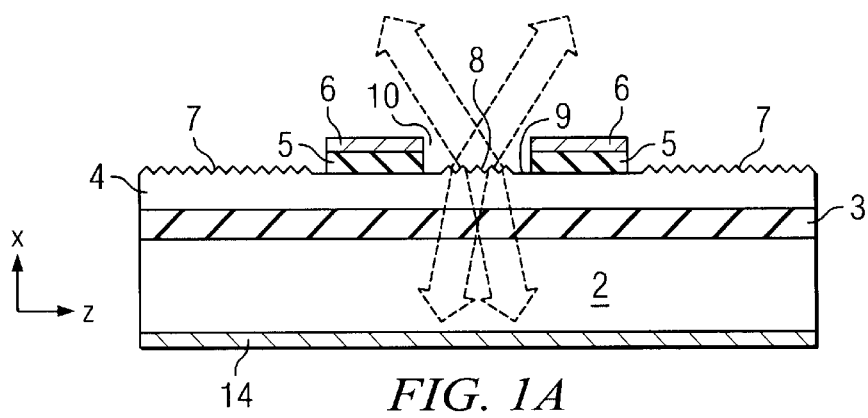
FIG. 1a shows side view of an innovative DBR laser.

The numerous innovative teachings of the present application will be described with particular reference to the presently preferred embodiment (by way of example, and not of limitation).

First order outcoupling gratings and second order or higher outcoupling gratings are both used in at least some embodiments of the present innovations. In the present application, first order DBR refers to a distributed Bragg reflector grating that reflects light within the waveguide in first order for feedback. A second order DBR grating will outcouple light in first order, and feedback light in second order.

In several variations in this application, second order feedback gratings (which couple light out in first order) are used. In such arrangements, the feedback grating depth or strength is varied in the y and z directions so that both the loss and the feedback from the grating help to stabilize the laser mode. For example, the first order lateral mode will be stabilized if the grating strength is varied so that the feed back varies like a Gaussian. This is accomplished by forming the grating so that its strength varies as $$1-exp[-(y/\omega)^2]$$

where y is the direction parallel with the feedback grating surface and perpendicular to the cavity length, with the origin taken to be at the center of the outcoupling grating, and omega is half the y grating dimension.

First order outcoupling gratings are gratings which couple light out of the waveguide plane in first order but may or may not satisfy the in-plane Bragg condition for second or higher order Bragg reflection. Such gratings may be designed to create no second or higher order reflections which feedback into the laser mode. In these variations which use such out-coupling gratings with no in-plane feedback, the gratings cause no destabilizing feedback into the laser mode and are mechanically and electrically isolated from the structure used to form and pump the resonant laser cavity. Thus, the length and position of the output grating can be chosen to suit the needs of the application for which the laser is designed. The grating periods required for outcoupling, with and without in-plane reflections, are summarized in "Surface Emitting Semiconductor Lasers and Arrays," G. A. Evans and J. M. Hammer, Eds., Academic Press, 1993, which is hereby incorporated by reference.

In general, second and higher order feedback gratings can result in some outcoupling. However, these are less preferred in the context of the present application since such higher order interactions are less efficient.

The outcoupling angle of the gratings in the innovative systems herein disclosed is measured as an angle from the normal to the surface of the outcoupling grating. Resonant outcoupling occurs when the outcoupling grating has a period that is equal to an integer number of wavelengths of the light in the cavity. A grating with period equal to the wavelength of light in the laser cavity will outcouple some light normal to the laser plane and reflect some light in-plane in second order. This means the light exits the grating parallel or nearly parallel to the normal. Outcoupling of light off the normal occurs when the grating is not an integer number of guide wavelengths, and in such a case the light exits the grating at an angle from the normal. This angle depends on the difference between the guide wavelength and the grating period. Varying the wavelength of light or the outcoupling grating period can therefore have great effect on the angle of outcoupled light. The out-coupling grating length, longitudinal position, and the output angles may therefore be chosen over a large range of values. The grating may also be shaped to achieve an output beam of a desired cross section. This is valuable for coupling the output light into fibers of different cross sectional size or at different angles than exactly or nearly normal. All of these "off normal" parameters may be varied without fear of significant mode destabilization or disruption of laser coherence. In the case of exactly or near normal outcoupling, there can be significant in-plane reflection that may (or may not) adversely affect the performance of the laser.

FIG. 1a shows a cross sectional view of a preferred embodiment, taken to show the x-z plane. It should be understood that the features in the several figures may not be to exact scale because of the large differences in dimension between the various structures illustrated.

Layers 3, 4, 5, and 6 are grown on a substrate 2 by known means. Each of these layers may comprise a number of sub-layers. Beneath the substrate is the n contact layer 14. The substrate may comprise a thick layer of n-type semiconductor with a top layer of similar n-type material interposed beneath layer 3. This is frequently called the n-cladding or n-clad. The n-clad will have a refractive index below that of layer 3. Layer 3 is the active and guiding layer usually containing the junction between p and n-type semiconductor materials. It may comprise, for example, a sequence of one or more barrier layers alternating with quantum well layers. Layer 4 is a p-type clad layer and has lower refractive index than layer 3. Layer 5 may be a multi-layer including a p-clad material chosen to enable good contact to 6 which is the p-metallic contact. Layer 14 provides the other electrical contact for the laser. There are many sequences of possible layers for semiconductor lasers and amplifiers, and the present innovations are not limited to the structures recited here. For example, a structure with a p-type rather than an n-type substrate (and all the necessary alterations to accommodate a change from p- to n-type materials and vice versa) is within the contemplation of the present application.

Gratings 7 are surface relief DBR gratings chosen to reflect light in the +/−z direction to form the laser cavity. (Note that these gratings can be buried structures within the device, and the term "surface relief" does not require the grating be on the surface of the device after processing.) The laser mode will be a standing wave which may be considered to be formed by two waves one flowing in the +z direction, the other in the −z direction. First order DBR gratings are preferred, but second or higher order gratings are also possible. The DBR grating depth and length and the thickness of layer 4 are chosen to provide the desired feedback as known in the art.

The reflector gratings can be given added functionality by varying their grating strength or amplitude in both the y (lateral) direction and the z (cavity) direction. Variation of the grating strength in the lateral direction will impart to the cavity mode light a Gaussian shape, allowing for more of the optical energy of the emitted light to be coupled into a circular mode, such as a fiber. Variation of the grating strength in the z direction can improve the suppression of unwanted longitudinal modes on either side of the desired longitudinal mode. the degree to which the unwanted modes are suppressed is called the side-mode suppression ratio.

The outcoupling grating 8 (sometimes referred to herein as OC grating, or OCG) is a surface relief grating with period chosen to couple light at desired angles from the grating plane. It is located at an aperture on the surface of the device. In a preferred embodiment, the outcoupling gratings are about 10 microns wide. The outcoupling grating may be shaped to control the shape of the emitted beam. The grating depth and thickness of the p-clad layer 9 in the vicinity of the grating 8 are chosen to provide the desired degree of outcoupling and to control beam shape. A window or aperture 10 in layers 5 and 6 is provided to allow unobstructed emission of light, and the size and shape of the outcoupling grating is matched to the mode of the fiber to which it couples light (in one embodiment). Because of the two standing waves in the cavity and reflection from the grating, the outcoupling grating simultaneously emits four different light beams, two above and two below the grating plane. These are depicted by dashed arrows. In the case of normal outcoupling of the laser light, the two top lobes are combined into a single beam, as are the two bottom lobes of emitted light.

In one embodiment, the outcoupled light is emitted normal to the surface, since one primary goal is to couple this light into a fiber. When light is emitted normal to the surface, the two top emitted beams are combined into a single beam, and likewise with the downward emitted beams.

Off normal emissions and slightly off normal emissions are also very useful. For example, changing the angle of entry to a fiber by several degrees has minimal impact on the coupling efficiency yet allows the use of an off resonance grating which minimizes undesired feedback into the laser. A larger angle might be desirable to send light to another detector to monitor the laser.

Figure 1B:
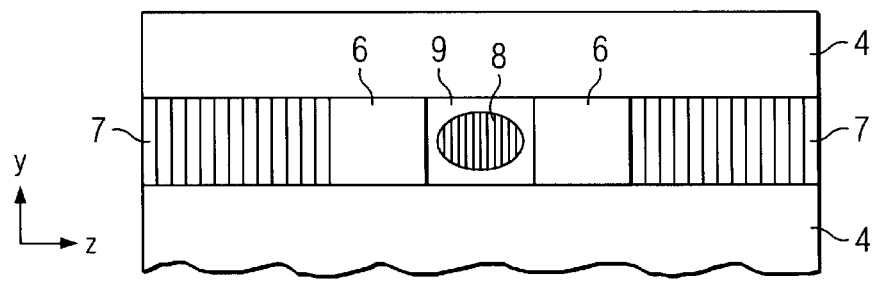
FIG. 1b shows a top view of an innovative DBR laser.

FIG. 1b shows a top view of a single grating outcoupled DBR laser. The outcoupling grating 8 is located at an outcoupling aperture within the envelop of the gain region. On either end of the laser are located distributed Bragg reflectors 7 for providing feedback into the cavity. Of course, cleaved facets may also be used instead of reflector gratings, with highly reflective coatings applied to reflect the light, as shown in later embodiments. With either DBR reflectors or coated facets, the reflectivity of one or both ends can be varied to allow light to escape the cavity for other purposes.

Another embodiment will be discussed with reference to FIGS. 2a and 2b. In this variation, crossed outcoupling gratings are located within the cavities of two (or more) semiconductor lasers arranged at angles to one another and located on a common substrate. In one embodiment, two lasers are used and are positioned at 90 degrees from one another, but more lasers are of course possible—see FIG. 7a for example. The shape and strength of the two gratings are chosen to produce desirable properties in the out-coupled light. Their periods are individually chosen to suit the desired application, such as to control outcoupling angle, or to couple out different wavelengths.

Figure 2A:
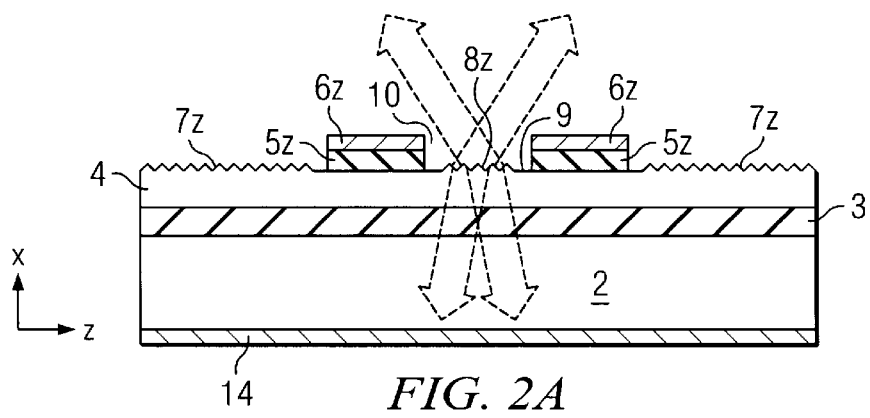
FIG. 2a shows a side view of crossed DBR lasers.

FIG. 2a shows a side view of the crossed grating outcoupled DBR lasers. The structure when seen from the side is similar to that of FIG. 1. Elements that are unique to the laser running in the z-direction are labeled with a z suffix, and elements unique to the laser running in the y-direction are labeled with a y suffix.

Figure 2B:
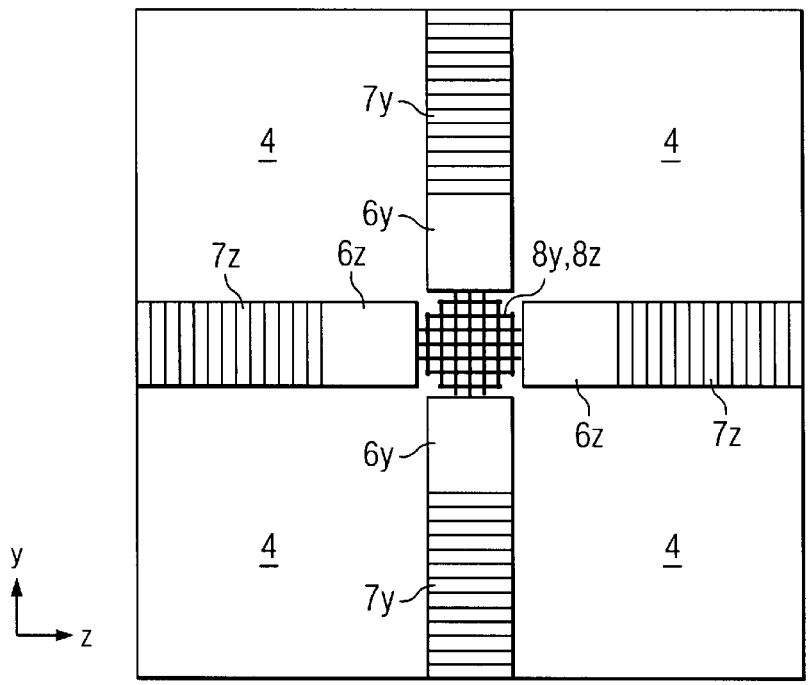
FIG. 2b shows a top view of crossed DBR lasers.

Referring to FIG. 2b, a top view, two crossed DBR lasers are at 90 degrees to one another. Each laser has its own set of reflector gratings 7y, 7z at either end, and both lasers have their own out-coupling grating 8y, 8z positioned at a common location between the reflector gratings. (In the preferred embodiment, the outcoupling aperture is located at the center of the laser, but this is not necessary.) On either side of the out-coupling gratings are the pumped regions of the lasers. (Note that in this variation, the two gain regions of a single laser are discontinuous, having different parts on either side of the outcoupling grating. Other possible embodiments include a single gain region with an outcoupling grating outside the gain region but between the reflector gratings, or even a single continuous gain region that spans the outcoupling grating, having portions on both sides.) The two out-coupling gratings are located at the same place, and the superposition of the two gratings forms a virtual grating with an effective period at an angle of about 45 degrees if the grating periods are about the same fore each laser.

The reflector grating periods are chosen to internally reflect the proper wavelength of light. The reflectivity of the DBR is very high at the Bragg condition, and drops off rapidly when the wavelength is different than the Bragg condition wavelength. This allows the wavelength of the output light to be controlled by controlling the period of the DBR gratings.

Referring again to FIG. 2a, in the case of crossed lasers, a cross section taken parallel to the x-y plane would be similar with layers noted with y subscripts in place of z subscripts.

Gratings 8y and 8z are surface relief outcoupling gratings with periods chosen to couple light at desired angles relative to the grating (y-z) plane. As shown in the figure, the gratings can be shaped to control the profile of the outcoupled beam. A circular profile for the grating is indicated (a more complicated profile would be optimal for fiber coupling), but any other useful shape can be produced, depending on the application. The grating depth along with the thicknesses and compositions of the epitaxial structure of the laser are chosen to provide the desired degree of outcoupling.

For each laser, four beams are emitted because of the left and right running waves that form the standing wave mode of the laser (unless the light is outcoupled perpendicular to the device). Two beams symmetrically angled around the normal will emerge above the grating plane and pass through the window 10. Similarly, two beams will be directed towards the substrate below. (Note the epi layers are transparent and this transparency can be made use of to couple light out through the bottom of the device. In such a case, a reflector is placed on the top of the device to direct the top emitted light back into the laser or out the bottom.) In some designs, the grating may be blazed to allow light to be outcoupled to the right or left of normal as well.

When two or more lasers are combined in this way, the crossed outcoupling gratings each polarize the light which they outcouple. In the case of two crossed gratings at 90 degrees, the two beams of light will be polarized at 90 degrees with respect to one another. Coupling light into a fiber with two orthogonal polarizations is required for pumping Raman amplifiers.

Figure 2C:
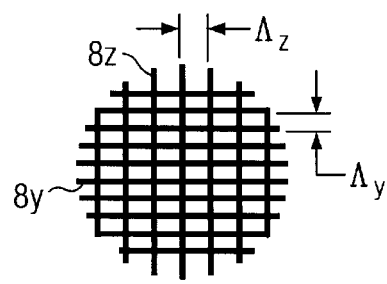
FIG. 2c shows a close up of crossed outcoupling gratings.

FIG. 2c shows a close up of the outcoupling gratings of FIGS. 2a and 2b. The periods, $L_y$ and $L_z$, of the superimposed two gratings need not be identical. The OCG periods will depend both on the wavelength of light in the cavity (which in turn depends on the periods of the DBR gratings at either end of the cavity) and on the desired outcoupling angle for the emitted beam. By choosing the two gratings to have different OC angles, spatial separation is possible, as may be desired by particular applications. In still another embodiment, the laser light from the devices is emitted normal to the surface, so that both wavelengths of light can be coupled into a fiber through the same aperture or location on the device.

By choosing a non-resonant spacing for the outcoupling grating period (i.e., a distance between grating lines that is not an integer multiple of the wavelength of light within the cavity) the output beams are emitted non-normal to the surface. This is useful in applications where, for example, the fiber into which the light is to be coupled is at an angle relative to the outcoupling grating.

The choice of normal or off normal outcoupling angles can have other advantages. For example, when two or more different wavelengths of light are coupled out of the OC gratings, all wavelengths can be coupled into the same fiber or separated as desired by varying the output angles of the individual gratings. For example, the individual outcoupling gratings for two crossed devices could each couple different wavelengths of light out normal to the surface to couple two different wavelengths into a single fiber mode. This is particularly applicable in the crossed grating out-coupled lasers, discussed further below. If, for some reason, only one wavelength is needed in the fiber, the light from the other device can be emitted off normal so as to not couple into the fiber. The non fiber coupled light could be deflected to a detector, for example. Regardless of the particular use, the choice of outcoupling angles is an advantage to a laser device, and the present application shows how different wavelengths from different sources can be selectively combined into a single region for coupling, or separated into different regions.

The shape and strength (i.e., the depth) of the OC gratings are chosen to produce desirable properties in the out-coupled light. The periods of all OC gratings can be individually chosen according to the needs of that particular laser and the application. For example, the two crossed OC gratings of FIG. 2b can be chosen to outcouple different wavelengths of light, allowing the two lasers of the crossed laser configuration to have different wavelengths, one in the z-direction, another in the y-direction. This of course extrapolates to higher numbers of lasers. Additionally, the two outcoupling gratings (and the different laser diodes themselves) can be chosen to emit the same wavelengths (for example, by making their feedback grating periods the same) allowing additional power and polarization variety in the outcoupled beam(s).

The basic idea can be extended to include a multiplicity of lasers radially arranged around a set of gratings oriented to outcouple light independently for each laser. This allows many wavelengths of light to be generated by merely choosing a different period for the pair of DBRs for each individual laser. The OC gratings can couple this light into a single spatial region (for example, to couple several wavelengths of light into a fiber for DWDM applications), or it can couple the different wavelengths out of the devices at different angles.

Referring still to FIG. 2b, which shows crossed lasers according to a preferred embodiment, if the Bragg reflector gratings are chosen to have the same period in both the y-direction laser and the z-direction laser so that both lasers operate at the same wavelength, and if the crossed OC grating period Lz is the same as Ly, the superposition of the two gratings at right angles results in a virtual grating with an effective period angle of about 45 degrees (if both grating periods are the same). In this case the possible coupling between the y and z lasers can be avoided if the gain regions use quantum wells with compressive strain and thus favor TE mode operation. The virtual grating at 45 degrees will not efficiently reflect TE modes and therefore will not couple the y and z lasers. On the other hand, the use of tensile strain in the quantum well favors TM modes, and may result in enough coupling to either lock the y and z lasers together into a single coherent source, or provide significant crosstalk and other interactions between the two lasers. Thus, the disclosed approach can choose the nature of the output beams to be either a combined single frequency coherent source, or two output beams with two independent wavelengths, or two beams with independent wavelengths but with a controlled amount of crosstalk between them.

The reflector grating periods for the pair of lasers can be the same, which provides additional power and polarization variety. Alternatively, the grating periods can be different, resulting in two different wavelengths of light being outcoupled. This latter configuration can couple light of different wavelengths out at the same angle for coupling light of different wavelengths into the same fiber, saving the cost of implementing a combiner for this function. For example, if the two lasers have different feedback grating periods, they will each generate a different wavelength of light. But both lasers can emit their light normal to the surface of their respective outcoupling grating by choosing each individual outcoupling grating to couple the necessary wavelength of light out normal to the surface.

The size of the grating output aperture can be adjusted for optimum coupling to single or to multi-mode fiber. Likewise, the efficiency of the output element (be it a grating or other element, such as a beam splitter or holographic optical element) can be adjusted by adding a layer of dielectric material to the outcoupling region. If outcoupling efficiency is too high, a high threshold current is required to lase because of the quantity of photons escaping the cavity. With a reflective layer atop the outcoupling grating, some of the light is reflected and continues to oscillate within the cavity. This has the effect of marginally decreasing the required current for lasing. Adding a dielectric layer (for example, nitride, or a dielectric stack, or even a reflective metallic layer) to the outcoupling location therefore controls outcoupling loss and decreases the required threshold current.

In any configuration of the present application where one or more gratings are located and superimposed on one another, the separate gratings can be individually formed by conventional means (including multiple exposures and etches to form the pattern) or can be merged into a single element using a holographic optical element (HOE). The optical requirements of the gratings can be calculated, and a HOE can be designed that accomplishes these required optical functions. Once designed, such a HOE can be patterned for lithography, and can therefore be fabricated in fewer process steps than it would take to create the multiple gratings separately. For example, multiple divergent beams can be captured and coupled into a single fiber with HOEs.

Figure 3:
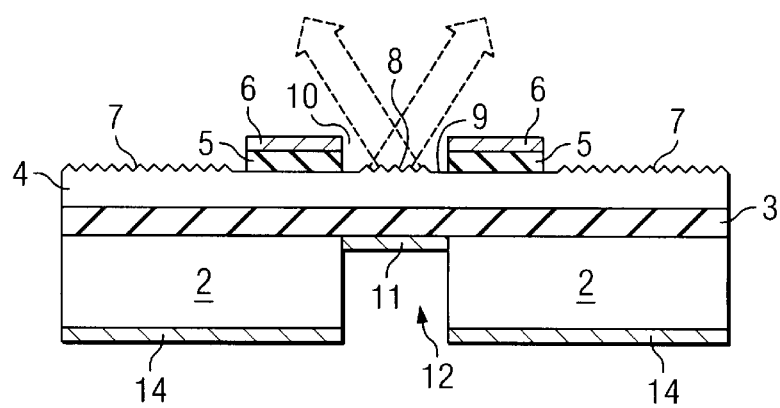
FIG. 3 shows a side view of a DBR laser with a reflective undercoating to reflect laser light.

In another embodiment, shown in FIG. 3, a reflecting surface is placed beneath the outcoupling gratings. This surface 11 reflects the two lower lobes of emitted light. This reflective layer can be made from a metallic substance or other material reflective to the necessary wavelengths of light, or it might be a reflective grating formed in the device, for example. By coupling the lower lobes back up and out of the OC grating, greater power is coupled out of the laser and may be captured by a fiber or other device, such as a detector to monitor the light produced by the device. A space 12 is shown in the substrate of the figure, but the same reflective surface can be placed with the substrate intact.

Figure 4A:
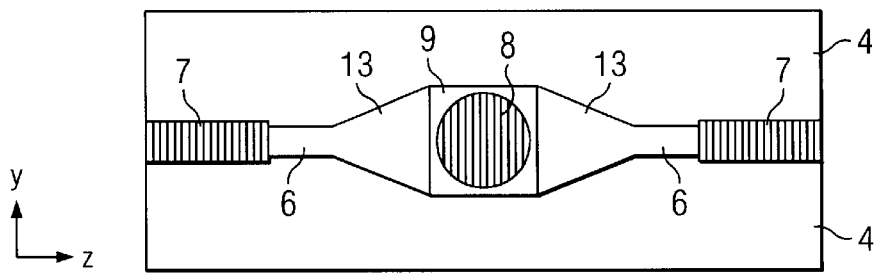
FIG. 4a shows a top view of a DBR with flared or tapering gain regions.

Another embodiment is shown in FIG. 4a, which shows a method to increase the lateral width of the gain regions at the outcoupling grating while maintaining a single-transverse mode. This is accomplished by using a single mode waveguide in the gain region that connects to a tapered gain region. The taper angle is related to the divergence of the fundamental mode of the single mode waveguide. In the preferred embodiment, the tapered regions have a laterally varying current contact, such as a gaussian contact to stabilize the modes in the tapered device.

The embodiment shown in FIG. 4a has a tapered gain region 13. The gain region in this sample has a straight portion as well. Different contacts are used in the preferred embodiment, pumping the different regions with increasing current as necessary. The tapered gain region ensures a wide-spatially-coherent mode, and avoids the restriction on the lateral (y) dimension imposed by the requirement of single lateral mode operation. A wide lateral mode allows the width of the output beam to be set by the width of the grating. The grating area can take a desired shape to match the needs of various applications. For example, circular, elliptical, or Gaussian beams can be produced.

Figure 4B:
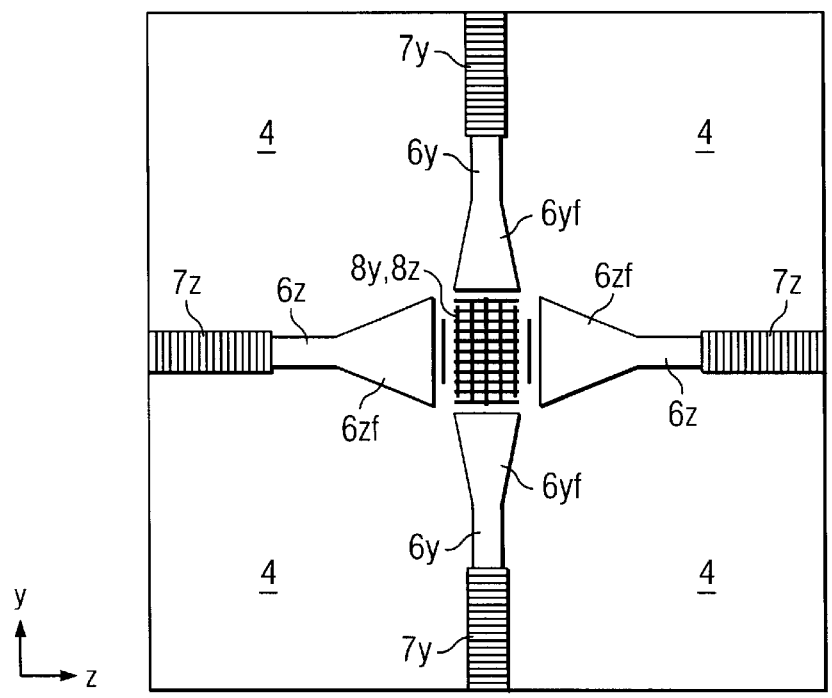
FIG. 4b shows a top view of crossed DBRs each with flared or tapered gain regions.

FIG. 4b shows the tapered gain regions used with multiple crossed grating outcoupled lasers. This embodiment shows two crossed GO (grating outcoupled) lasers at 90 degrees to one another. DBR gratings 7y, 7z, create the cavity as in other embodiments discussed above. The pumped regions of the lasers in this variation have a flared section (labeled with the f suffix), being wider closer to the OC gratings. In this example, one laser has an outcoupling grating that is circular in shape, while the other laser has an outcoupling grating that is rectangular. Using a tapered gain region, outcoupled beams of a greater range of sizes can be produced, as the gain region can be made to whatever width is necessary to accommodate (or fully take advantage of) the size of the OC grating. Tapered gain regions also increase the total amount of emitted power from the device.

Figure 5A:
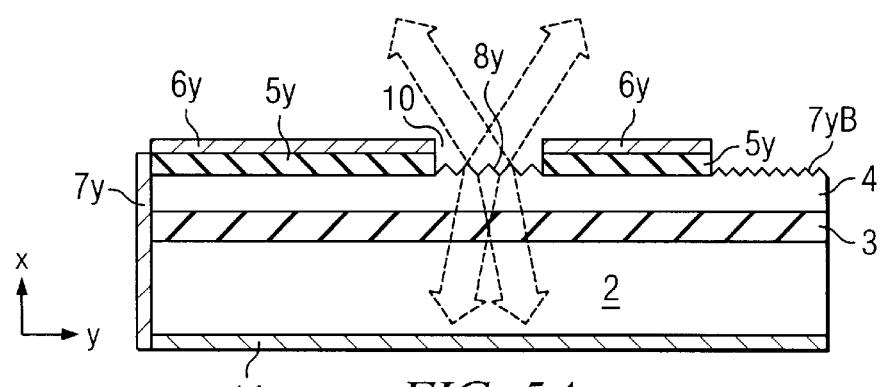
FIG. 5a shows a side view of a laser diode having a DBR at one end and a cleaved facet at the other end.

Another embodiment is shown in FIG. 5a. At one end of the laser, the DBR has been replaced by a reflective end facet 7y. There are still two gain region portions, separated by the OC grating in this embodiment. The other end of the laser has a DBR 7yB, the period of which determines the wavelength that will be stable in the cavity.

Figure 5B:
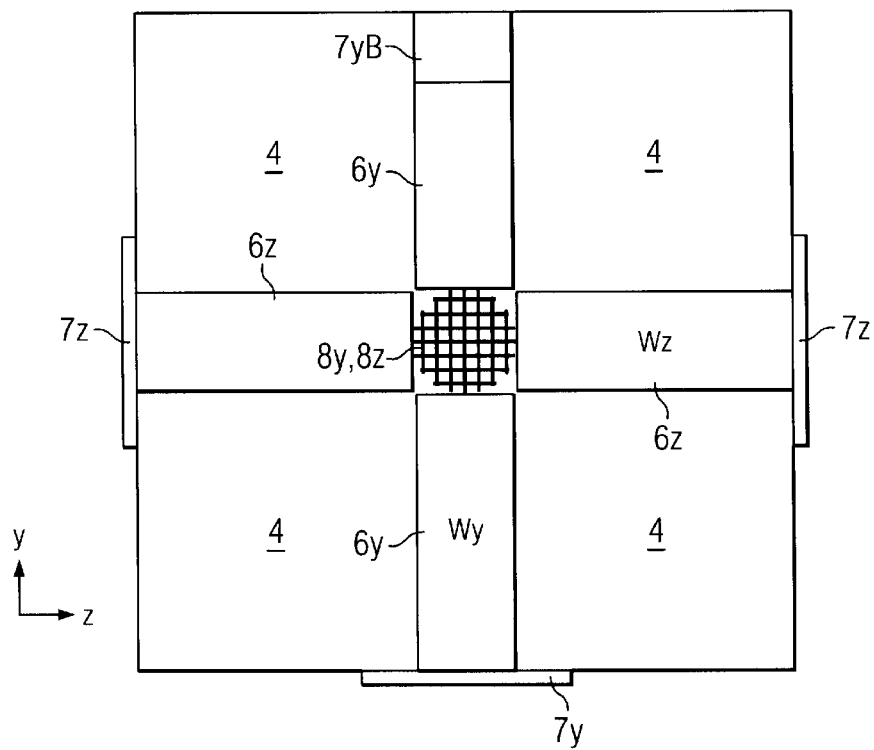
FIG. 5b shows a top view of crossed lasers, using both DBRs and reflecting facets.

A top view of a crossed GO laser system is shown in FIG. 5b. In this variation, the laser running in the z-direction (horizontal in the figure) has reflective end facets on both ends, and no DBRs for reflecting the light in the cavity. The y-direction laser (vertical in the figure) has a DBR at one end, and a reflective facet at the other end. Cleaved facet ends reduce the length of the device since the length of the DBR sections is omitted.

Figure 5C:
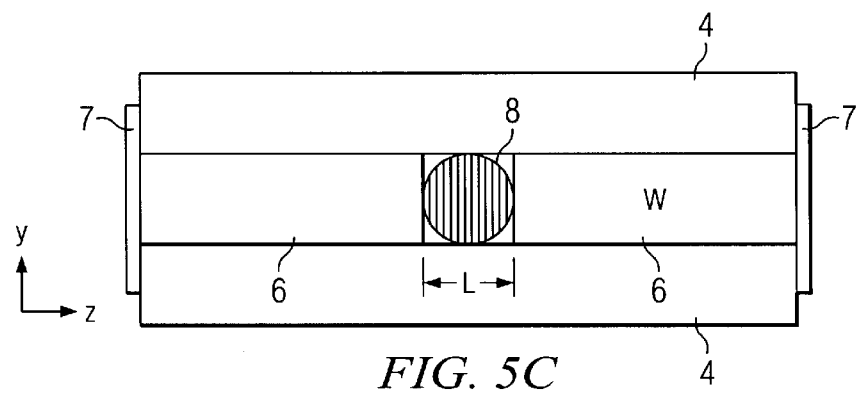
FIG. 5c shows a top view of a laser diode using cleaved facets.

FIG. 5c shows a top view of a laser diode with cleaved facets at both ends. The length of the gain region is fixed by the reflectivity of the end facets or the DBRs.

Figure 6:
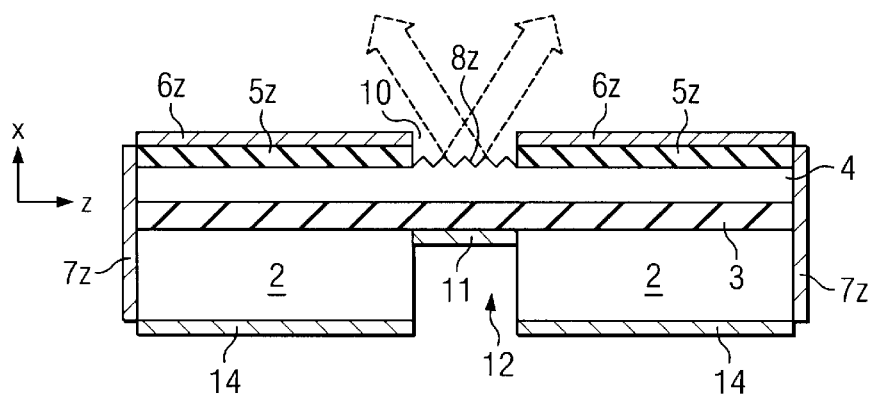
FIG. 6 shows a laser diode using cleaved facets and a reflective layer beneath part of the waveguide.

FIG. 6 shows a laser with two reflective end facets and an OC grating between the pumped regions. Beneath the OC grating is a reflector for reflecting the two downward directed beams back up toward the surface of the laser. Capturing the downward beams is useful to increase efficiency.

Figure 7A:
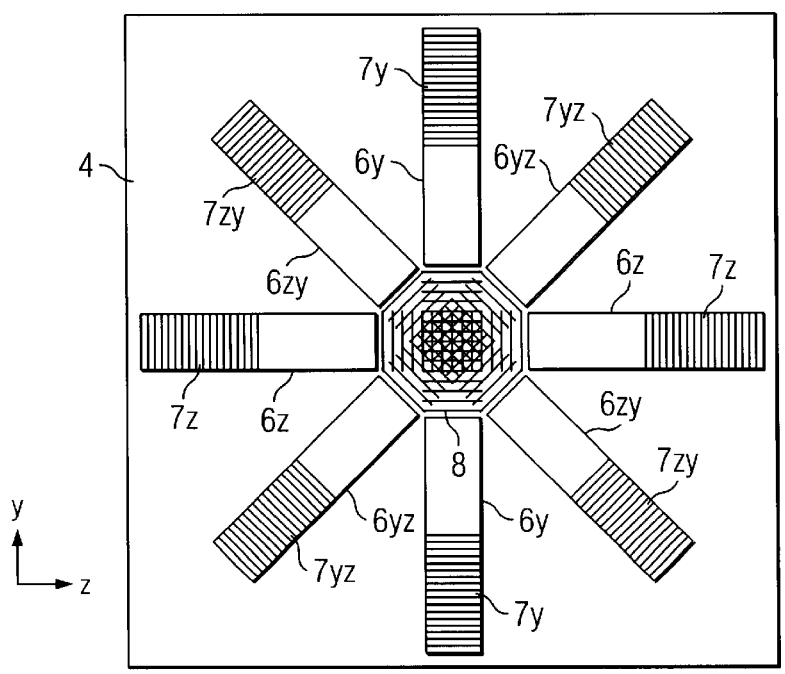
FIG. 7a shows a top view of four crossed DBR lasers each outcoupling light from the same outcoupling element.
Figure 7B:
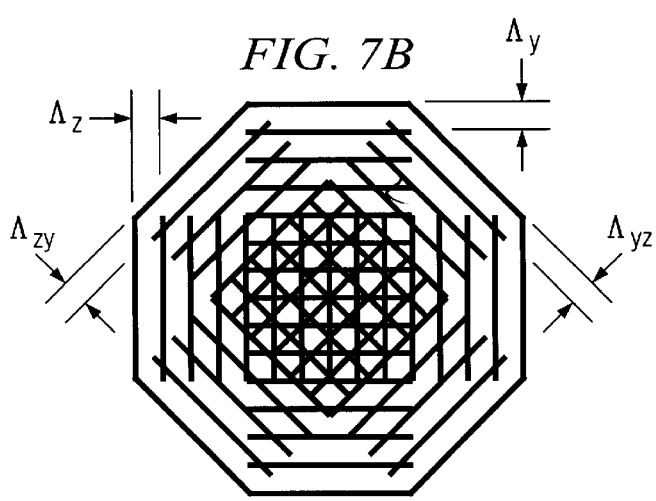

FIG. 7a shows a GO laser system with four crossed lasers being outcoupled at the same spatial location. Distributed Bragg reflectors are shown in this example at each end of the individual lasers. Each laser has its own OC grating superimposed on the other OC gratings to create one virtual grating. (Note that it is possible to overlap the gratings in different planes, having either curved waveguides or making each laser totally in a different plane than the others, but this is a less preferred embodiment. HOEs can be used in place of multiple gratings in such a situation.) FIG. 7b shows a close-up of the outcoupling gratings for the four laser system. There are four gratings, each at a 45 degree angle to the adjacent gratings. The periods of these gratings need not be the same, which allows the use of multiple wavelengths being outcoupled at the same location (assuming the lasers themselves are fashioned to output different wavelengths). The periods of the various gratings are labeled as Lz, Ly, Lzy, and Lyz.

The structure of the grating outcoupled laser allows for the high-level integration of electronic circuitry with the laser device. Many different possible devices can be integrated with the GO laser of the present application, including control electronics and photonic integrated circuits that can be placed on the chip with the laser; electronic integration includes higher level data management electronics such as serialization/deserialization, clock generation and recovery, op amps and analog-to-digital and digital-to-analog converters. The GO laser geometry is also advantageous in that it allows for integration with optical waveguides and integration of light routing circuitry on the chip. Such photonic integration allows optical interconnects between circuit elements, integration of optical isolators, wavelength tunable sections, optical modulators, waveguide couplers, waveguide switches, and simultaneous integration of multiple ones of these components.

Figure 8:
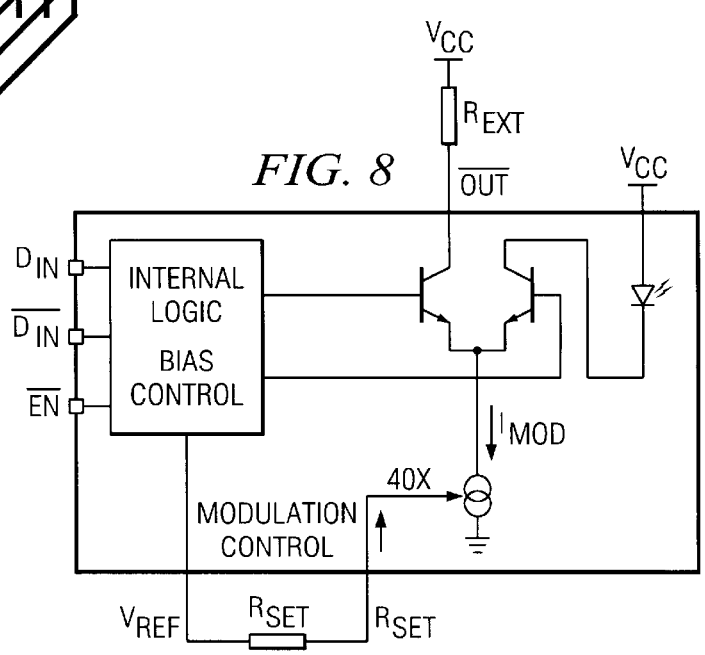
FIG. 8 shows a circuit diagram of integrated elements with the presently disclosed laser system.

FIG. 8 shows an example of a higher level circuit integration on the same chip as the grating outcoupled laser diode. In this example, laser driver and control electronics are integrated. Din and Din-bar are differential data inputs and EN is the chip enable. Internal logic and BIAS control is used to center the data to the inputs of the driver pair and to provide a Vref output. This output is used with Rset to control the current source or modulation current Imod which sets the output current to the grating outcoupled laser diode. The resistor Rext is external to minimize the power dissipation capacity, both Rext and Rset may be integrated as well.

Figure 9:
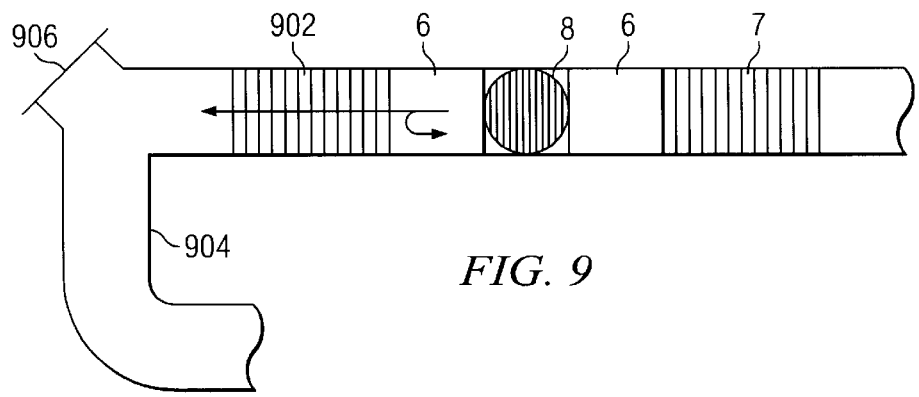
FIG. 9 shows optical waveguides routing light from the laser to other elements.

FIG. 9 shows the optical waveguide technology routing the light from the laser source to another integrated circuit component, for example. One end of the laser has a partially transmitting reflector 902 which allows some of the light to pass through. This light is guided by a waveguide 904 to another circuit element as desired for any given application. In the example shown, a corner turning mirror 906 is used to guide the light.

Figure 10:
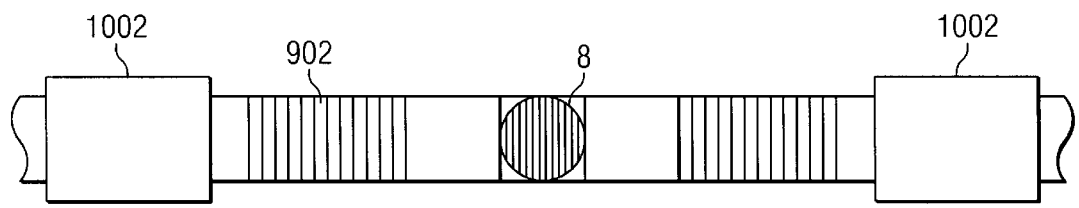
FIG. 10 shows a possible configuration for integrated elements with a laser diode.

Other devices can also be integrated on the same chip with the innovative laser system of the present application. FIG. 10 shows a grating outcoupled laser diode with the OCG 8 between the two reflectors 902 at either end of the cavity. One or both reflectors are partially transmitting gratings in this example. In this variation, a waveguide coupler, which may be used for connecting to other integrated devices, is located outside the laser cavity. A location for such an integrated device 1002 is shown at either end of the cavity. Of course, other devices could also be integrated, for example, modulators or tuning sections.

Figure 11:
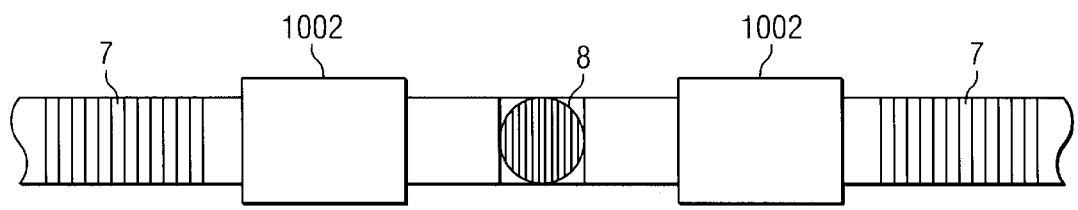
FIG. 11 shows another possible configuration for integrating added elements to the present innovations.

FIG. 11 shows another possible variation for integrating added components (such as a phase adjustor, for example). In this example, two regions 1002 where added devices may be fabricated on chip are shown. In this example, the added components are located within the length of the laser, possibly requiring the gain region contacts to be moved or altered to accommodate the added device.

Figure 12:
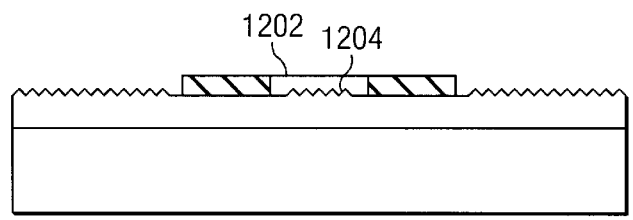
FIG. 12 shows another embodiment of the present application.

FIG. 12 shows another embodiment of the present innovations. In this variation, a reflective coating 1202 (for example, a dielectric stack or a metal layer) is placed on top of the device, where the outcoupling grating 1204 is located. This reflective coating causes the light to be coupled through the bottom of the device. (Note that it is often useful to allow some light to escape the top of the device in this design, as this light can be used to allow easier wafer level probe testing of the device.) If an outcoupling grating is used without such a reflective coating, there is of course light emitted both above and below the waveguide due to reflection from the grating. The reflective coating causes the top emitted lobe of light to instead be emitted through the bottom of the device, so that substantially all light emitted from the cavity is coupled out through the substrate material, which is a transparent material, usually about 100 microns thick. The reflective coating can be metallic (such as gold) or it can be a dielectric stack for better reflection. Generally, if the light is to be emitted out the bottom of the device, a high reflect (HR) coating is placed on top of the device to reflect the light downward. An anti-reflect (AR) coating may be added to the bottom of the device in this case. Alternatively, if the light is to be emitted out the top surface, the HR coating may be placed on the bottom of the device, and an AR coating placed on top.

Causing the light to be emitted through the bottom of the device has the advantage of allowing the heat sink to be placed on the top of the laser, closer to the locations where heat is generated, increasing efficiency of heat sinking. In such a case, the device is preferably mounted "upside down", with the reflective coating and DBRs beneath, the substrate on top, facing a fiber core for coupling, for example. This variation helps feedback in the cavity and can decrease threshold current by 50% or more.

In FIG. 12, the laser device is shown with an outcoupling aperture between the DBRs. An outcoupling grating is shown in this example. On top of this grating is located a reflective coating that directs outcoupled light down through the substrate.

Figure 13:
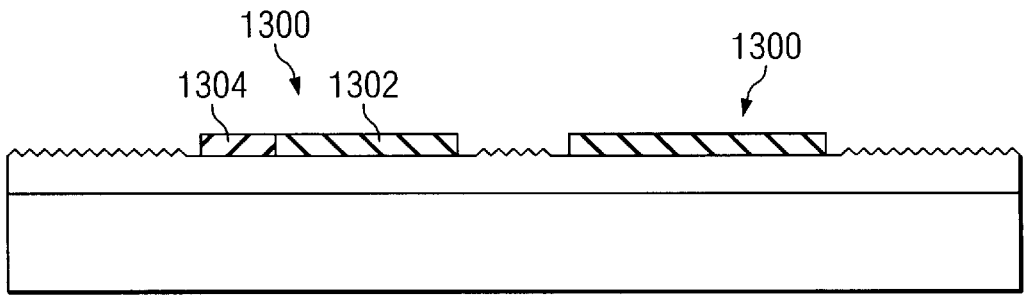
FIG. 13 shows another embodiment of the present application.

The gain region or regions of the present innovations can be modified to provide added functionality. FIG. 13 shows a DBR laser according to an embodiment of the present innovations. The gain region 1300 has multiple parts in this example, one on either side of an outcoupling grating. One part of the gain region is further split into two parts, a larger 1302 and a smaller 1304 section. The smaller part, which can be used to more sensitively adjust the current supplied to the gain region, is used for several purposes. It can be used as a fine tuning device for the wavelength of the light in the cavity. By increasing or decreasing the current, the wavelength can be slightly tuned to some degree. The smaller contact can also be used to modulate the signal generated in the cavity. By varying the supplied current over time, the intensity of the emitted light can be varied. This can be used to modulate the signal by adjusting the current over time to alter the intensity of light, and thus embed a signal in the emitted light. The smaller contact is the preferred one to use for such modulation, since it will allow faster modulation (due to lower capacitance, etc.).

Figure 14:
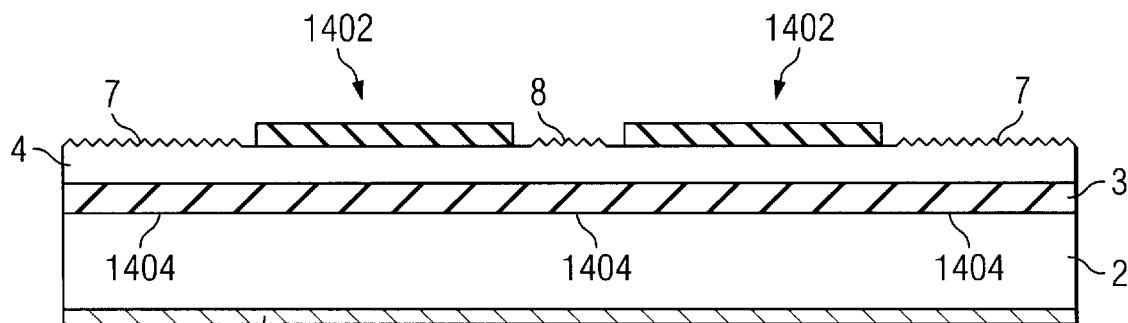
FIG. 14 shows a DBR laser with thinned quantum wells beneath the outcoupling grating and beneath the DBRs.

FIG. 14 shows a side view of a DBR laser according to another embodiment. The laser has a cavity and two reflector gratings 7, one at each end. Between the reflector gratings are the gain region 1402 and the outcoupling grating 8.

The waveguide 3 in the laser may be made from multiple layers including an active and guiding layer containing the junction between the p and n type semiconductor materials. For example, this region might comprise a sequence of one or more barrier layers alternating with quantum well layers.

In the embodiment shown in the figure, the quantum wells 1404 are made thinner beneath the reflector gratings 7 and beneath the outcoupling grating 8. This results in a less lossy, more transparent device. The larger bandgap in the thinner quantum well regions (i.e., in the unpumped regions) means less absorption of photons in the cavity because higher photon transition energy is required. This lowers internal loss, increases efficiency, and lowers the required threshold current for the device.

The quantum well thickness, by controlling the required transition energy, affects the wavelength of the photons that will lase in the cavity. This allows large scale tunability of the device during fabrication by controlling quantum well formation.

Quantum wells are fabricated at different thicknesses using selective growth of epitaxial layers. This selective growth phase of processing can also be used to simultaneously improve the performance of integrated components such as electro-absorption modulators, which benefit from quantum well structures that can be made more transparent (or have a higher photon transition energy). The integrated devices are fabricated at the same time and during the same set of processes as the lasers themselves, and selective growth can be used on them without significant process cost added.

Figure 15:
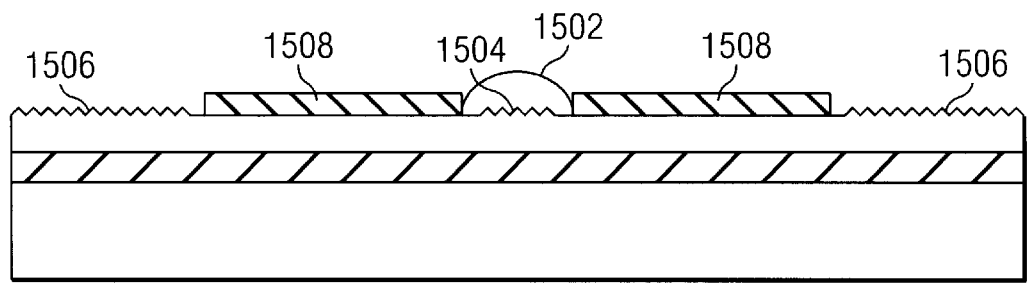
FIG. 15 shows another embodiment of the present application.

FIG. 15 shows another embodiment. In this variation, a fractional-spherical lens 1502 made of an optical polymer is formed on the outcoupling grating 1504 (by a microjet process, for example). This lens acts to make different wavelengths of light (which may exit the OCG at different angles than the normal, or from one another) converge to be coupled into a fiber mode, for example. Since the index of refraction of the material outside the lens is lower than the index of refraction of the lens, light rays passing through the lens to the lower index material will be refracted away from the normal to the surface of the lens at that point. Depending on the index difference, the refraction can be great or small. This element can be used to allow design margin in the size of the outcoupling grating. With the added lens, the outcoupling grating can be made larger, (50 microns, for example), which is useful in high power applications. Normally, an outcoupling grating of 10 micron size can outcouple light in the hundreds of milliwatt range or higher, but with larger outcoupling gratings light of higher power, well above a watt, can be outcoupled and confined to a fiber mode.

Other types of intermediate lens devices (gratings, HOEs, etc.) can also be used at this location to aid in coupling light from the outcoupling grating into a fiber core (for example). Such devices can be made on chip, or be separate devices added after processing is complete.

FIG. 15 shows a sample embodiment of the device. This embodiment comprises a DBR laser as described previously in this application, with outcoupling grating 1504 located between the two reflector gratings 1506. Gain regions 1508 are on either side of the OCG. A lens 1502 which is partly spherical in shape is formed on the outcoupling grating.

Following is a description of an innovative modulation technique for optical signals. The innovations disclosed herein are particularly applicable to semiconductor devices such as laser diodes (LDs) and the like, and will be discussed in terms of these devices. However, it should be noted that these techniques are applicable beyond the range of examples mentioned here, which are presented to describe the present innovations.

FIG. 16 shows a preferred embodiment. In this example, laser diode 1600 generates light. Laser diode 1600 is formed using distributed Bragg reflectors (DBRs) 1602, 1604 at either end to reflect the light in the cavity. An outcoupling element 1606 is positioned between the two ends of laser 1600. The outcoupling element preferably comprises an outcoupling grating (referred to as the OC grating, or OCG). Pumped regions 1608 preferably exist on either side (but may exist on only one side) of outcoupling aperture 1606. Also on either side of the OCG are integrated optical switches 1610 capable of directing (all or a portion of) the light from the cavity into an alternate waveguide structure 1612. This alternate waveguide 1612 optically attaches to the primary waveguide on both sides of the outcoupling grating 1606. At each location where the waveguides come in close proximity (i.e., where they are optically coupled), there is preferably located a switch 1610 that controls the path of the light at that juncture.

In this example, the light signal is modulated using switches 1610. If switches 1610 are in a first state, the light stays in the primary waveguide and escapes through the OCG 1606. When the switch is toggled, the light is instead coupled out of the primary waveguide into the secondary waveguide 1612. Of course, in this case the light does not emit from the OCG, but instead passes through the newly formed cavity. Thus by toggling the switch, the light signal is modulated by varying the intensity of output light through the output aperture 1606.

Depending on the type of switches implemented and the type of coupling between the waveguides that is used, some or all of the light can be controlled by the switches. In one example embodiment, the switches cause substantially all the light from the first waveguide to couple into the second waveguide. In another example embodiment, only part of the light from the first waveguide is coupled into the second waveguide. This results in a variation of the intensity of light emitted from the laser diode, rather than an "on/off" variation.

Coupling efficiency can be improved by implementing grating assisted coupling in the design, which provides a grating between the two waveguides at the coupling location, and which aids in coupling light between the two waveguides in a shorter distance than is normally required.

The switches in this example comprise electric contacts which abut or are placed very near to at least one of the waveguides (either waveguide, or both waveguides can be so equipped) in the region where the two waveguides are close to one another. By varying the voltage applied, the optical properties of the waveguide near the contact are altered. Varying the optical properties of either of the waveguides causes the evanescent coupling of photons between the two waveguides (which are in close proximity) to increase or decrease. Hence, by varying the voltage applied to a contact near the coupling region, the amount of light coupled between the waveguides is varied, and hence the amount of light emitted from the outcoupling grating is also varied. This system is used to modulate the light emitted from the laser diode system.

Of course, other methods can be used to modulate the emitted light, such as direct current injection to the device. However, this causes chirp (i.e., it varies the wavelength of photons in the cavity) and causes photon density to change (which limits the modulation speed), both of which are typically undesirable properties in a laser diode depending on the application of the laser. In most cases, the optical paths of the two waveguides (such as the two waveguides presented in FIG. 16, et al.) should be kept as optically similar as possible, so as to keep photon density the same, reducing wavelength variation and allowing faster modulation speeds than can be achieved with direct injection current modulation.

FIG. 17 shows a variation on this embodiment. In this case, the alternate waveguide 1712 has an outcoupling grating 1714 of its own. Such a variation is useful, for instance, to match the optical losses between the primary and alternate waveguides. Adding the outcoupling grating 1714 will not only make the secondary waveguide 1712 optically more similar to the primary waveguide, but it also allows the signal to be directed to other types of devices for other uses. For example, a detector can monitor the laser diode from the emissions of this OCG.

Figure 18:
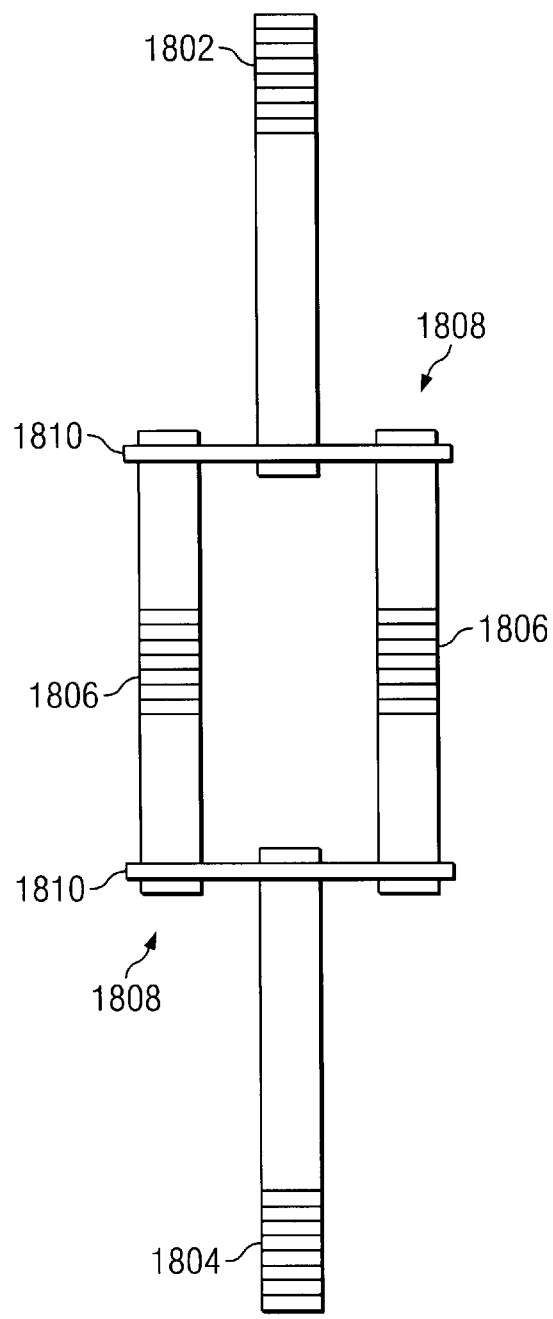
FIG. 18 shows a dual-path optical modulation system and laser diode according to the present innovations.

In another variation, the wave guide is split into two equal paths each with an outcoupling grating 1806. The central waveguide has reflectors at either end, 1802, 1804. Such a design is shown in FIG. 18. Optical switches 1810 are located at the waveguide junctions 1808, and control which of the paths the light is coupled into. The choice of which path need not be between a 100% coupling into one path or the other. It might be merely a relative distribution of power in either path. For example, the two paths can have an 80 to 20 percent ratio of optical power distribution between them, and the switch reverses that distribution, so that the dominant path becomes the weaker path, and vice versa. This switching between the two possible paths is used to modulate the signal from the LD. Of course in this case, both outcoupling gratings are not to be coupled ultimately to the same transmission fiber. The unused output can be used in other ways as mentioned above. For example, the other outcoupling grating can be directed to another element (such as a detector) or to nothing at all. Depending on system requirements and tolerances, balancing the system optically may be more or less important. In cases where exact balancing is important, the two outcoupling gratings could couple into the same type of fiber to maintain similar optical feedback (and other) qualities. If balancing requirements are not strict, other less optically balanced options, such as those mentioned above, can be employed.

Alternatively, the system of FIG. 18 could use twin fibers to couple both outputs for redundant or fully differential coupling, wherein much smaller optical (e.g., intensity) differences are monitored for modulation or other purposes.

In another version, a laser diode is formed with two reflective facets (one at either end), with two pumped regions between the mirrors. Between the pumped regions is an outcoupling grating where the beam is emitted. On either side of the outcoupling grating is an integrated optical switch capable of coupling the light from the waveguide into another path as shown. This second path forms an alternative to the path with the outcoupling grating. Thus when the switch is in one setting, the light does not enter the alternate path and is emitted as normal from the outcoupling grating. When the switch is thrown, the light within the waveguide is directed to the alternate path, which avoids the outcoupling grating. By alternating the switch in a controlled way, the light signal from the outcoupling grating can thus be modulated.

This variation can be coupled with the balanced variation shown in FIG. 18, above, by replacing the DBRs with cleaved reflective end facets, for example.

Figure 19:
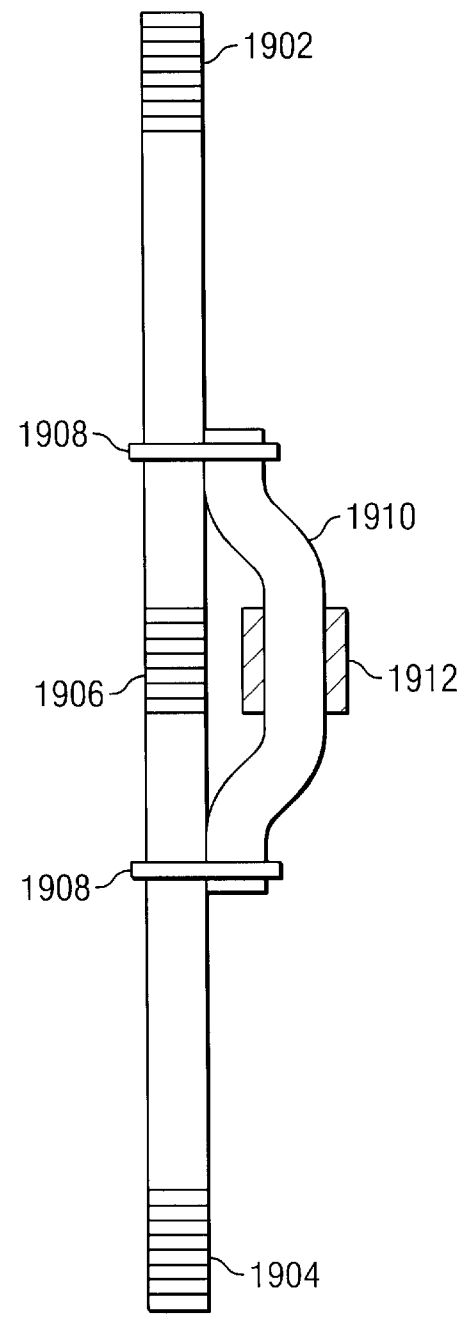
FIG. 19 shows an optical modulation system using the electro-optic effect, according to the present innovations.

The present application shows another modulation technique for optical signals. In this example, shown in FIG. 19, a laser diode generates light for the optical signal. A waveguide preferably has distributed Bragg reflectors 1902, 1904 on either end, with outcoupling element 1906 of some kind between the two ends. On either side of the outcoupling element 1906 are the pumped regions. Light is generated in an active layer and is reflected within the waveguide by the DBRs at either end. Light is coupled out of the waveguide by the outcoupling grating 1906.

On either side of the outcoupling grating 1906 there is a switch 1908 at a region where the light may couple into another waveguide 1910 (through, for example, evanescent coupling). This allows another path to exist for the light from the LD, creating two cavities using the same set of reflectors, one cavity having the outcoupling grating 1906 in the middle, the other having electrodes 1912 positioned so as to vary the optical properties of that part of the waveguide using the electro-optic effect. The electrode in the middle of the second waveguide modifies the optical propoerties of the second waveguide and thereby changes the optical length of the laser cavity which changes the phase and or frequency of the laser light. Such a system can be used to frequency or phase modulate the grating outcoupled laser light.

Of course it is understood that coupling and switching for the described systems can be accomplished by an known means, including evanescent coupling, for example, or integrated optical switches. Though mechanical switches are possible, they are slower than preferred for modulation of light signals.

Definitions:

Following are short definitions of the usual meanings of some of the technical terms which are used in the present application. (However, those of ordinary skill will recognize whether the context requires a different meaning.) Additional definitions can be found in the standard technical dictionaries and journals.

Chirped Grating: a grating whose period varies over its area.;

DBR: Distributed Bragg Reflector;

DFB: Distributed Feedback (Laser);

DWDM: Dense Wavelength Division Multiplexing;

GO: Grating Outcoupled (Laser);

HOE: Holographic Optical Element;

LED: Light Emitting Diode;

LD: Laser Diode

Modulate: any controlled variation of the signal, in intensity or frequency or phase;

OCG: Outcoupling Grating;

VCSEL: Vertical Cavity Surface Emitting Laser;

Waveguide: a structure which guides the propagation of photons, usually by internal reflection.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A laser diode device comprising:
    a first waveguide having a first reflector at a first end of the first waveguide and a second reflector at a second end of the first waveguide, the first waveguide having an outcoupling aperture positioned to couple light out of the first waveguide at a location between the first and second reflectors of the first waveguide, wherein the first waveguide is a cavity of a laser diode of the device;
    a second waveguide;
    wherein the first end of the second waveguide is optically connected to the first waveguide at a first switch between the first reflector of the first waveguide and the outcoupling aperture of the first waveguide;
    wherein the second end of the second waveguide is optically connected to the first waveguide at a second switch between the second reflector of the first waveguide and the outcoupling aperture of the first waveguide; and
    wherein when the first and second switches are in a first state, light from the first waveguide is transmitted into the second waveguide.

2. The laser diode system of claim 1, wherein when the first and second switches are in a second state, light from the first waveguide is not transmitted into the second waveguide.

3. The laser diode system of claim 1, wherein the first and second switches comprise electrical contacts to the first waveguide which alter optical properties of at least a part of the first waveguide when a voltage is applied.

4. The laser diode system of claim 1, wherein the second waveguide has an outcoupling aperture positioned to couple light out of the second waveguide at a location between the first and second switches.

5. The laser diode system of claim 4, wherein the outcoupling aperture of the first waveguide couples light into a first fiber, and the outcoupling aperture of the second waveguide couples light into a second fiber.

6. The laser diode system of claim 1, wherein the first and second reflectors of the first waveguide comprise first order distributed Bragg reflectors and wherein the outcoupling aperture of the first waveguide comprises a second order distributed Bragg reflector.

7. A laser diode device, comprising:
    a first waveguide having a first reflector at a first end of the first waveguide and a switch at a second end of the first waveguide;
    a second waveguide having a second reflector at a first end of the second waveguide and a switch at a second end of the second waveguide, wherein the first and second reflectors and first and second waveguides comprise a cavity of a laser diode of the device;
    a third waveguide having an outcoupling aperture, the third waveguide optically connected to receive a first portion of photons from the first and second waveguides;
    a fourth waveguide optically connected to receive a second portion of photons from the first and second waveguides;
    wherein the state of the switch of the first waveguide and the state of the switch of the second waveguide determines the relative sizes of the first and second portions of photons.

8. The laser diode system of claim 7, wherein both the third and fourth waveguides have outcoupling apertures.

9. The laser diode system of claim 7, wherein the first portion is 100% and the second portion is 0%.

10. The laser diode system of claim 7, wherein the first portion is 80% and the second portion is 20%.

11. The laser diode system of claim 7, wherein the switch of the first waveguide comprises an electrical contact to the first waveguide which alters optical properties of at least a part of the first waveguide when a voltage is applied, and wherein the switch of the second waveguide comprises an electrical contact to the second waveguide which alters optical properties of at least a part of the second waveguide when a voltage is applied.

12. The laser diode system of claim 7, wherein the reflector of the first waveguide comprises a first order distributed Bragg reflector and wherein the outcoupling aperture of the third waveguide comprises a second order distributed Bragg reflector.

13. A laser diode device, comprising:
- a first waveguide having a first reflector at a first end of the first waveguide;
- a second waveguide having a second reflector at a first end of the second waveguide, wherein the first and second reflectors and first and second waveguides comprise a cavity of a laser diode of the device;
- a third waveguide having an outcoupling aperture, the third waveguide being optically coupled to receive photons from the first and second waveguides;
- a fourth waveguide, the fourth waveguide being optically coupled to receive photons from the first and second waveguides;
- a first switch system connected to control the degree of coupling between the first waveguide and the third and fourth waveguides; and
- a second switch system connected to control the degree of coupling between the second waveguide and the third and fourth waveguides.

14. The laser diode system of claim 13, wherein the first and second reflectors of the first waveguide comprise first order distributed Bragg reflectors and wherein the outcoupling aperture of the third waveguide comprises a second order distributed Bragg reflector.

15. The laser diode system of claim 13, wherein the first switch system comprises a first electrode on the first waveguide, a second electrode on the third waveguide, and a third electrode on the fourth waveguide such that optical properties of at least parts of the first, third, and fourth waveguides are altered by applying voltages to the first, second, and third electrodes.

16. A laser diode device, comprising:
- a first waveguide having a first reflector at a first end of the first waveguide and a second reflector at a second end of the first waveguide, the first waveguide having an outcoupling aperture positioned to couple light out of the first waveguide between the first and second reflectors of the first waveguide, the first waveguide and first and second reflectors forming a cavity of a laser diode of the device;
- a second waveguide;
- wherein the first end of the second waveguide is optically connected to the first waveguide at a first location between the first reflector of the first waveguide and the outcoupling aperture of the first waveguide; and
- wherein the second end of the second waveguide is optically connected to the first waveguide at a second location between the second reflector of the first waveguide and the outcoupling aperture of the first waveguide.

17. The laser diode system of claim 16, wherein the second waveguide has an electrical element disposed thereon; and wherein light emitted at the outcoupling aperture is modulated by varying a voltage applied to the electrical element.

18. The laser diode system of claim 16, further comprising a first electrical contact to the first waveguide at the first location and a second electrical contact to the first waveguide at the second location; and wherein light emitted at the outcoupling aperture is modulated by varying a voltage applied to the first and second electrical contacts.

19. A laser diode system, comprising:
- a first waveguide having a first reflector at a first end of the first waveguide and a second reflector at a second end of the first waveguide, the first waveguide having an outcoupling aperture positioned to couple light out of the first waveguide at a location between the first and second reflectors of the first waveguide, the first waveguide and first and second reflectors forming a cavity of a laser diode of the device;
- a second waveguide;
- wherein the first waveguide has an electrical element connected thereto;
- wherein the first end of the second waveguide is optically connected to the first waveguide at a first location between the first reflector of the first waveguide and the outcoupling aperture of the first waveguide;
- wherein the second end of the second waveguide is optically connected to the first waveguide at a second location between the second reflector of the first waveguide and the outcoupling aperture of the first waveguide; and
- wherein light emitted at the outcoupling aperture is modulated by varying a voltage applied to the electrical element.

20. The laser diode system of claim 19, further comprising a first electrical contact to the first waveguide at the first location and a second electrical contact to the first waveguide at the second location; and wherein light emitted at the outcoupling aperture is modulated by varying the voltage applied to the first and second electrical contacts.

* * * * *

UNITED STATES PATENT AND TRADEMARK OFFICE
CERTIFICATE OF CORRECTION

PATENT NO. : 6,714,575 B2　　　　　　　　　　　　　　　　　　　　　　　　Page 1 of 1
DATED : March 30, 2004
INVENTOR(S) : Evans It is certified that error appears in the above-identified patent and that said Letters Patent is hereby corrected as shown below:

Column 4,
Line 8, after "existing", delete "VCSELS" and insert -- VCSELs --.

Signed and Sealed this

First Day of November, 2005

JON W. DUDAS
*Director of the United States Patent and Trademark Office*